(12) United States Patent
Hopper et al.

(10) Patent No.: US 7,652,348 B1
(45) Date of Patent: Jan. 26, 2010

(54) APPARATUS AND METHOD FOR WAFER LEVEL FABRICATION OF HIGH VALUE INDUCTORS ON SEMICONDUCTOR INTEGRATED CIRCUITS

(75) Inventors: Peter J. Hopper, San Jose, CA (US); Peter Johnson, Sunnyvale, CA (US); Kyuwoon Hwang, Palo Alto, CA (US); Andrei Papou, San Jose, CA (US)

(73) Assignee: National Semiconductor Corporation, Santa Clara, CA (US)

(*) Notice: Subject to any disclaimer, the term of this patent is extended or adjusted under 35 U.S.C. 154(b) by 52 days.

(21) Appl. No.: 11/495,143

(22) Filed: Jul. 27, 2006

(51) Int. Cl.
*H01L 21/20* (2006.01)

(52) U.S. Cl. .............. 257/531; 257/E21.022; 438/381

(58) Field of Classification Search .......... 257/516, 257/531, E21.022; 323/282; 438/381
See application file for complete search history.

(56) References Cited

U.S. PATENT DOCUMENTS

| | | | |
|---|---|---|---|
| 5,204,809 A | 4/1993 | Andersen | |
| 5,355,301 A * | 10/1994 | Saito et al. | 363/147 |
| 5,541,135 A | 7/1996 | Pfeifer et al. | |
| 5,869,148 A | 2/1999 | Silverscholtz et al. | |
| 6,166,422 A | 12/2000 | Qian et al. | |
| 6,249,039 B1 | 6/2001 | Harvey et al. | |
| 6,396,122 B1 * | 5/2002 | Howard et al. | 257/531 |
| 6,462,976 B1 * | 10/2002 | Olejniczak et al. | 363/147 |
| 6,867,903 B2 | 3/2005 | Imajuku et al. | |
| 6,940,147 B2 * | 9/2005 | Crawford et al. | 257/531 |
| 7,232,733 B2 * | 6/2007 | Lotfi et al. | 438/332 |
| 2002/0097129 A1 | 7/2002 | Johnson | |
| 2003/0005569 A1 | 1/2003 | Hiatt et al. | |
| 2004/0263310 A1 * | 12/2004 | Ding et al. | 336/223 |

OTHER PUBLICATIONS

Hwang et al., U.S. Appl. No. 11/111,660, "Patterned Magnetic Layer On-Chip Inductor" filed Apr. 21, 2005.
U.S. Appl. No. 11/504,972, filed Aug. 15, 2006.
Hopper et al., U.S. Appl. No. 11/504,972 entitled "Apparatus and Method for Wafer Level Fabrication of High Value Inductors on Semiconductor Integrated Circuits" filed Aug. 15, 2006.
Johnson et al., U.S. Appl. No. 11/274,932 entitled "Apparatus and Method for Fabricating High Value Inductors on Semiconductor Integrated Circuits" filed Nov. 14, 2005.

(Continued)

*Primary Examiner*—Lex Malsawma
*Assistant Examiner*—Robert Huber
(74) *Attorney, Agent, or Firm*—Beyer Law Group LLP

(57) ABSTRACT

An apparatus and method for wafer level fabrication of high value inductors directly on top of semiconductor integrated circuits. The apparatus and method includes fabricating a semiconductor wafer including a plurality of dice, each of the dice including power circuitry. Once the wafer is fabricated, then a plurality of inductors are fabricated directly onto the plurality of dice on the wafer and are in electrical contact with a switching node of the power circuitry on each die respectively. The inductors are fabricated by forming a plurality of magnetic core inductor members on an interconnect dielectric layer for each die on the wafer. An insulating layer and then inductor coils are then formed over the plurality of magnetic core inductor members over each die. A layer of magnetic paste is also optionally provided over each inductor coil to further increase inductance.

26 Claims, 5 Drawing Sheets

OTHER PUBLICATIONS

Hopper et al., U.S. Appl. No. 11/041,658 entitled "Integrated Switching Voltage Regulator Using Copper Process Technology" filed Jan. 24, 2005.

U.S. Appl. No. 10/658,433 entitled "High Density Integrated Inductor with Core" filed Sep. 8, 2003.

Hwang et al., "Patterned Magnetic Layer On-Chip Inductor" filed Apr. 21, 2005.

Johnson et al., U.S. App. No. 11/137,767 entitled Method of Improving On-Chip Power Inductor Performance in DC-DC Regulators filed May 25, 2005.

"The Concise Colour Science Dictionary", Ofxord University Press, 1997, p. 708.

Office Action from U.S. Appl. No. 11/504,972 dated Nov. 26, 2008.

* cited by examiner

APPARATUS AND METHOD FOR WAFER LEVEL FABRICATION OF HIGH VALUE INDUCTORS ON SEMICONDUCTOR INTEGRATED CIRCUITS

BACKGROUND

1. Field of the Invention

The present invention relates to semiconductor integrated circuits, and more particularly, to an apparatus and method for wafer level fabrication of high value inductors directly on top of semiconductor integrated circuits.

2. Background of the Invention

Inductors are commonly used in the electronics industry for storing magnetic energy. An inductor is typically created by providing an electric current though a metal conductor, such as a metal plate or bar. The current passing though the metal conductor creates a magnet field or flux around the conductor. The amount of inductance is measured in terms of Henries. In the semiconductor industry, it is known to form inductors on integrated circuits. The inductors are typically created by fabricating what is commonly called an "air coil" inductor on the chip. The air coil inductor is usually either aluminum or some other metal patterned in a helical, toroidal or a "watch spring" coil shape. By applying a current through the inductor, the magnetic flux is created.

Inductors are used on chips for a number of applications. Perhaps the most common application is direct current to direct current or DC to DC switching regulators. In many situations, however, on chip inductors do not generate enough flux or energy for a particular application. When this occurs, very often an off-chip discrete inductor is used.

There are a number of problems in using off-chip inductors. Foremost, they tend to be expensive. With advances in semiconductor process technology, millions upon millions of transistors can be fabricated onto a single chip. With all these transistors, designers have been able to cram a tremendous amount of functionality onto a single chip and an entire system on just one or a handful of chips. Providing an off-chip inductor can therefore be relatively expensive. Off-chip inductors can also be problematic in situations where space is at a premium. In a cell phone or personal digital assistant (PDA) for example, it may be difficult to squeeze a discrete inductor into a compact package. As a result, the consumer product may not be as small or compact as desired.

An apparatus and method for wafer level fabrication of high value inductors directly on top of semiconductor integrated circuits is therefore needed.

SUMMARY OF THE INVENTION

An apparatus and method for wafer level fabrication of high value inductors directly on top of semiconductor integrated circuits is disclosed. The apparatus and method includes fabricating a semiconductor wafer including a plurality of dice, each of the dice including power circuitry and a switching node. Once the wafer is fabricated, then a plurality of inductors are fabricated directly onto the plurality of dice on the wafer respectively. For each die, electrical connections are made between the switching node and the inductor respectively. Each inductor is fabricated by forming a plurality of magnetic core inductor members on an interconnect dielectric layer formed on the wafer. An insulating layer, and then inductor coils, are then formed over the plurality of magnetic core inductor members over each die. A layer of magnetic paste is also optionally provided over each inductor coil to further increase inductance.

BRIEF DESCRIPTION OF THE DRAWINGS

Like elements are designated by like reference numbers in the Figures.

DETAILED DESCRIPTION OF THE PREFERRED EMBODIMENTS

Figure 1:
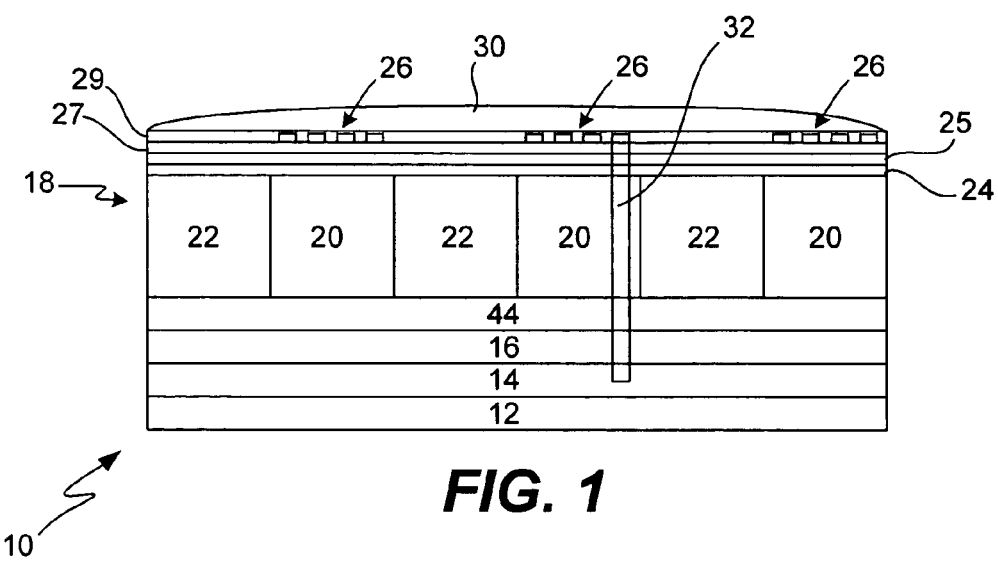
FIG. 1 is a cross section of a semiconductor integrated circuit die with power circuitry fabricated and an inductor fabricated thereon according to the present invention.

Referring to FIG. 1, a cross section of a semiconductor integrated circuit die with power circuitry and an inductor fabricated directly thereon according to the present invention is shown. The die 10 includes a silicon substrate 12 with power circuitry fabricated thereon in accordance with well known semiconductor manufacturing techniques (for the sake of simplicity, the circuitry is not visible in the figure), metal interconnect layer(s) 14 including one or more levels of metal interconnect, and an interconnect dielectric layer 16 formed over the metal interconnect layers 14. An inductor 18 is fabricated directly on a plating layer 44 formed over the interconnect dielectric layer 16. The inductor 18 includes a plurality of magnetic core inductor members 20 provided between resists spacers 22, a planarization surface 24 formed over the inductor members 20 and spacers 22, an insulating layer 25, a plating layer 27, an inductor coil 26 formed within another resist layer 29, and a magnetic paste 30 formed over the inductor coil 26. An electrical contact 32 is provided between the coil 26 and a switching node (not shown) provided in one of the metal layers of interconnect 14.

The present invention is directed to the wafer level fabrication of the inductor 18 directly onto the die 10 in wafer form. FIGS. 2 and 3A through 3E illustrate the fabrication sequence.

Figure 2:
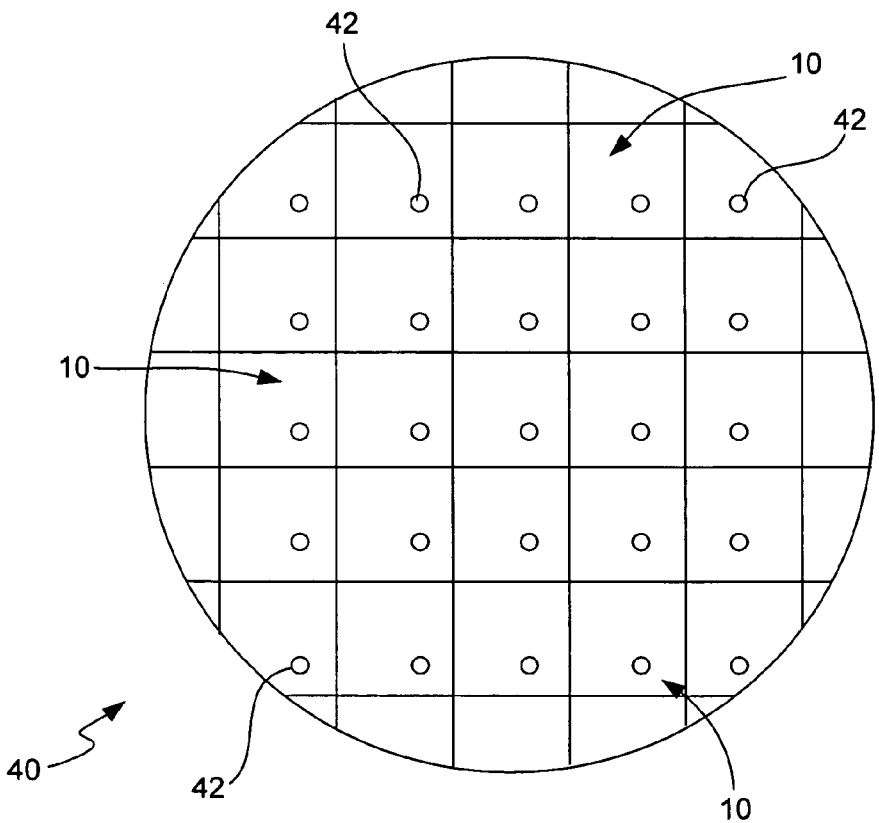
FIG. 2 is a semiconductor wafer including a plurality of dice with power circuitry fabricated thereon according to the present invention.

Referring to FIG. 2, a semiconductor wafer 40 including a plurality of dice 10 is shown. Each die 10 includes power regulation circuitry fabricated thereon, including a switching node 42. For the sake of simplicity, the power regulation circuitry is not shown or described herein. The switching node 42 is typically a metal contact of one of the metal interconnect layers 14. The switching node 42 is in electrical contact with the underlying transistors forming the power regulation circuitry on the device. In the subsequent discussion with regard to FIGS. 3A through 3E, the wafer level fabrication process for forming the inductor 18 on top of the die 10 is described in detail.

Figure 3A:
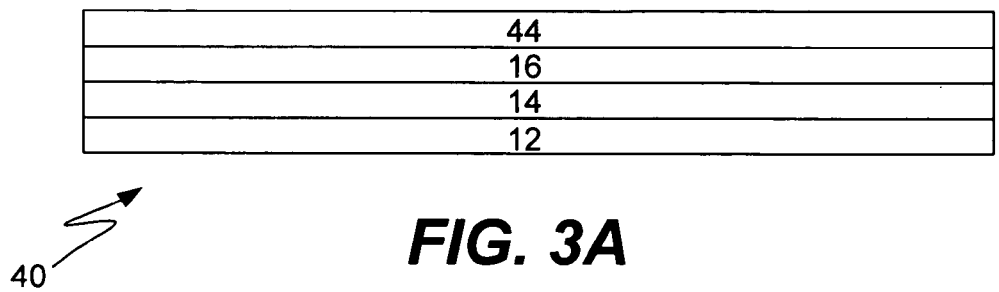
FIGS. 3A through 3E are a series of cross sections illustrating the fabrication of the inductors fabricated on the wafer according to the present invention.

Referring to FIG. 3A, a cross section of the wafer 40 is shown. The wafer includes the silicon substrate 12 having the power regulation circuitry fabricated thereon, metal interconnect layers 14, and the interconnect dielectric layer 16 formed over the metal layers 14. The fabrication of the design and fabrication of the power circuitry and metal interconnect levels 14 are well known and therefore are not described in detail herein.

The initial step in the fabrication of the inductor 18 involves the forming of a plating layer 44 across the top surface of the wafer 40. The plating layer 44 actually includes three layers, including an underlying oxide protection layer, a middle seed layer, and an upper adhesion layer. In one embodiment, the plating layer 44 is formed by sputtering 300 Angstroms of titanium, 3000 Angstroms of copper, and 300 Angstroms of titanium on the wafer surface to form the protection, seed, and adhesion layers respectively. It should be noted that specific embodiment disclosed herein in merely exemplary, and that a plating layer 44 can be formed using any one of a number of well known techniques and materials and the invention should not be construed as limited to the metals and thicknesses disclosed herein.

Figure 3B:
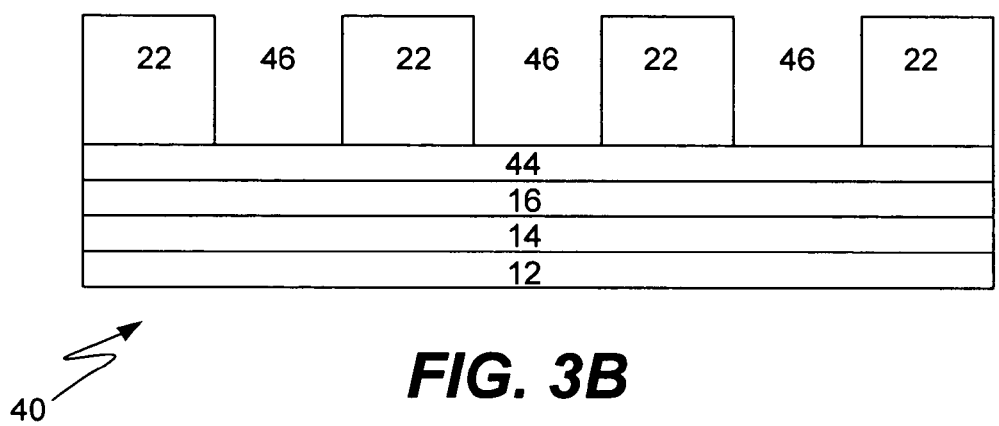

In the next step as illustrated in FIG. 3B, the photo resist layer 22 is formed over the plating layer 44. In various embodiments, the photo resist layer 22 can be a spin-on BCB or SU8 layer approximately 30 microns thick. Once the resist layer 22 is formed, it is patterned to form a set of recess regions 46 that expose the underlying plating layer 44. The recess regions 44 are formed using well known photolithography techniques including masking, exposing and etching of the resist layer 22. The recess regions 46 form what are in essence "molds" which will be later used to form the magnetic core inductor members 22.

Figure 3C:
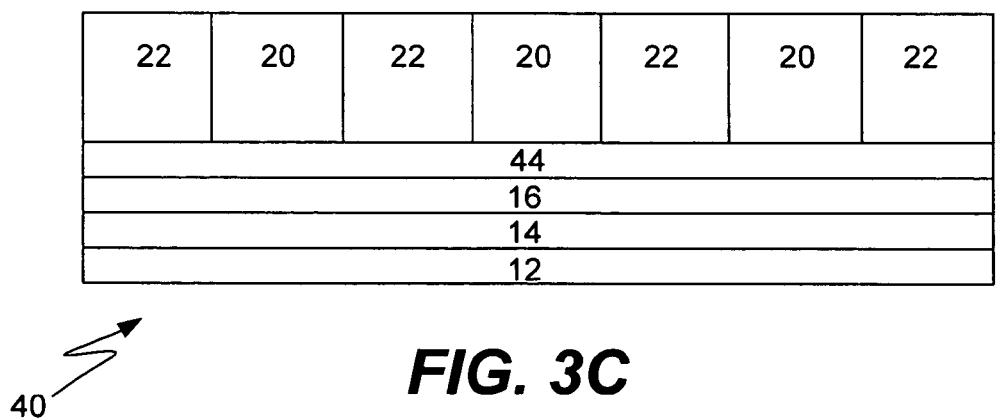

As illustrated in FIG. 3C, the magnetic core inductor members 20 are formed within the molds or recess regions 46 by electroplating. The upper adhesion layer of titanium is stripped away, exposing the underlying copper seed layer of the plating layer 44. A negative bias or voltage is then applied to the wafer 40 while submerged in a NiFe plating bath. During the plating, the recess regions 46 are filed with NiFe, forming the magnetic core inductor members 20. The recess regions 46 thus define the shape and location of the inductor members 20 on each die on the wafer 30.

Figure 3D:
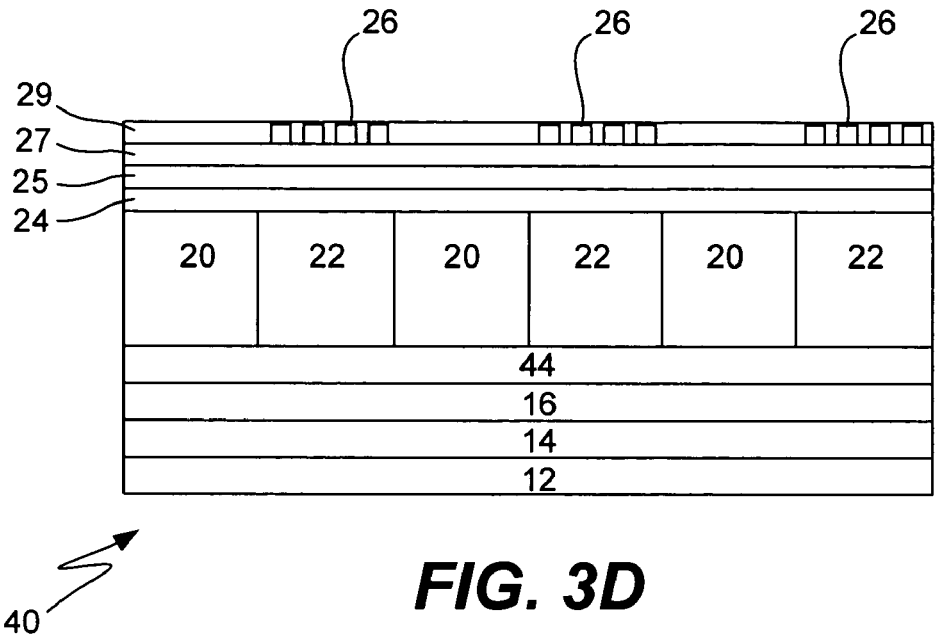

As illustrated in FIG. 3D, the inductor coils 26 are next formed on the wafer surface. After the inductor members 20 are formed, the planarization layer 24 is created across the top surface of the wafer. In one embodiment, the planarization layer 24 is a spin-on layer such as BCB or SU8. Once the layer is formed, it is planarized or smoothed using chemical mechanical polishing (CMP), as is well known in the semiconductor fabrication art. A dielectric insulating layer 25 is next formed across the wafer surface. In various embodiments, the insulating layer 25 is formed by performing a plasma enhanced chemical vapor deposit of a material such as oxide, spinning on a polymer such as BCB or SU8, or a chemical vapor deposition of a polymer such as Paralyne.

The inductor coils 26 are formed is a manner similar to that described above with regard to the inductor members 20. Specifically, another plating layer 27 including an underlying oxide protection layer, a middle seed layer, and an upper adhesion layer, is formed across the wafer surface. Thereafter, a photo resist layer 29 is formed and patterned, forming recess regions which expose the top adhesive of the plating layer 27. The top adhesion layer is then stripped away, and the wafer 40 undergoes a plating operation in a copper bath. The inductor coils 26 are formed by the plating of copper in the bath onto the exposed seed layer within the recess regions. For the sake of brevity, the aforementioned steps are not illustrated in detail in the figure. The process, however, is essentially the same as that described above, and is therefore not repeated herein.

In the next step, the electrical contacts 32 are provided between the coils 26 and the underlying switching nodes (not shown) provided one of the metal layers of interconnect 14. The electrical contacts are formed by etching vias into the top surface of the wafer down to the switching node contact of each die 10. The vias are then filled with an electrically conductive material such as aluminum or copper. For the sake of simplicity, only one electrical contact 32 is illustrated in the Figures.

Figure 3E:
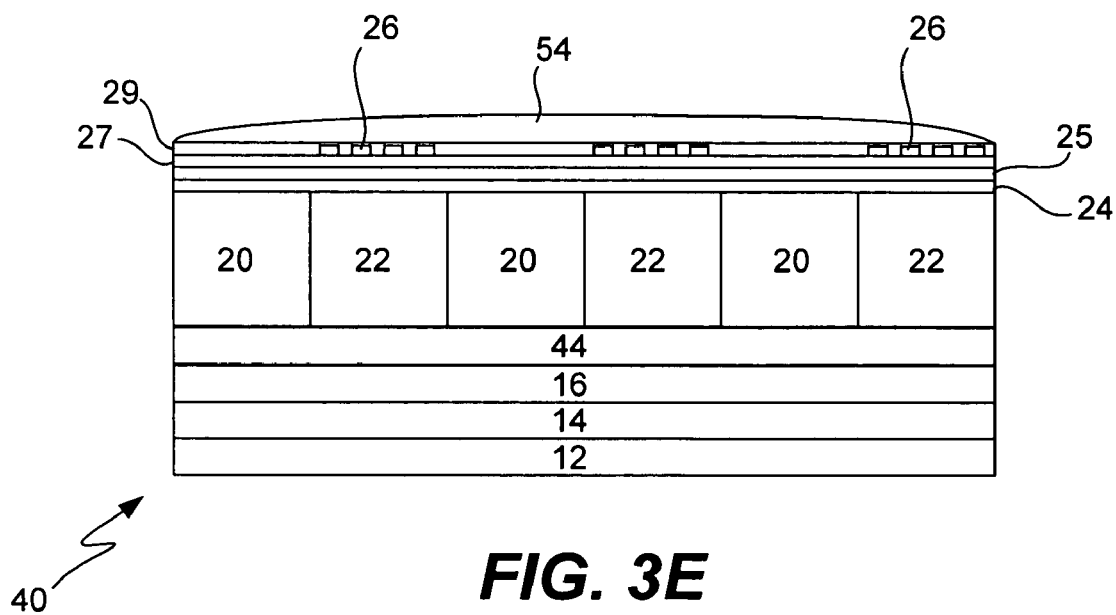

In the final step, as illustrated in FIG. 3E, a "blob" of magnetic paste 30 is extruded over the top surface of the wafer 40. The magnetic paste 30, according to various embodiments, can be either a non-conductive epoxy or a polymer filled with magnetic particles. An example of the type of magnetic particles could be MnZn ferrite, although many other types of magnetic particles could be used. In another specific embodiment, the particles are of various sizes ranging from 1 to 10 microns. The size variation is useful in increasing the fill factor of the magnetic particles. In one embodiment, the fill factor is between 80 to 90 percent.

Figure 4A:
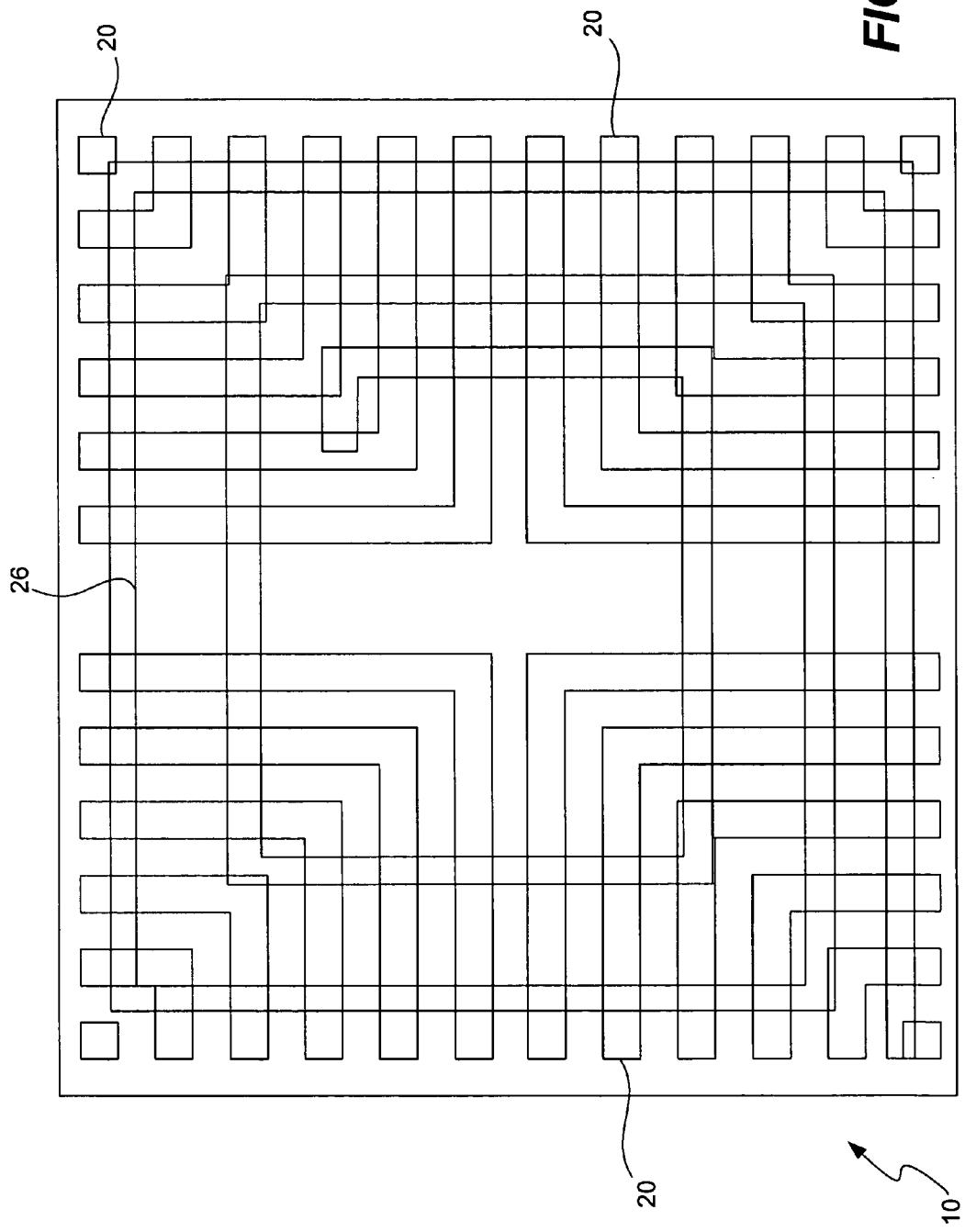
FIGS. 4A and 4B illustrate various pattern arrangements of magnetic core inductors and inductor coils of the inductors fabricated onto the wafer according to the present invention.
Figure 4B:
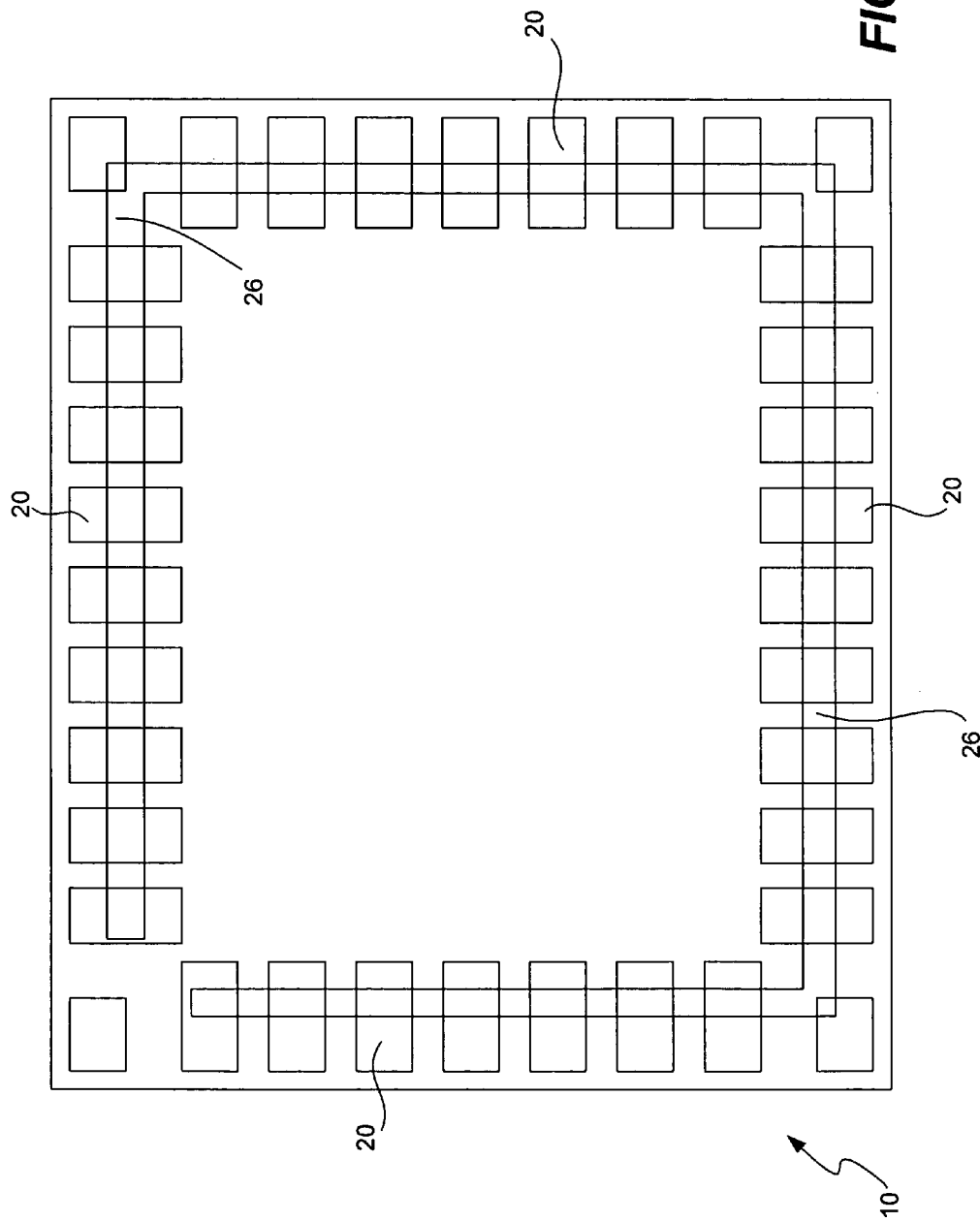

FIGS. 4A and 4B illustrate various pattern arrangements of magnetic core inductors 20 and inductor coils 26 of the inductors fabricated onto the wafer according to the present invention. It should be noted that these two embodiments are exemplary and in no way should they be construed as limiting. In FIG. 4A, the magnetic core inductors 20 are arranged in a chevron pattern in the four corners of the die 10 while the coil 26 is a multi-turn coil formed thereon. In FIG. 4b, the magnetic core inductors 20 are positioned around the periphery of the die 10, which the coil 26 makes a single turn. In each example, the magnetic core inductor members 20 are laminations perpendicular to the direction of current flow through the inductor coil 26.

In accordance with the present invention, the layout of the inductors 20 and coils 26 is arbitrary and can be done in any desirable manner. It should be made clear that the patterns shown in FIGS. 4A and 4B are arbitrary and should not be construed as limiting the invention.

While this invention has been described in terms of several preferred embodiments, there are alteration, permutations, and equivalents, which fall within the scope of this invention. It should also be noted that there are many alternative ways of implementing the methods and apparatuses of the present invention. For example, the steps of the present invention may be used to form a plurality of high value inductors 10 across many die on a semiconductor wafer. It is therefore intended that the following appended claims be interpreted as including all such alterations, permutations, and equivalents as fall within the true spirit and scope of the present invention.

What is claimed is:

1. An apparatus, comprising:
   an integrated circuit with power regulation circuitry fabricated thereon;
   a switching node contact in electrical connection with the power regulation circuitry on the integrated circuit;
   an interconnect dielectric layer formed over the power regulation circuitry and the switching node contact of the integrated circuit;
   a plurality of magnetic core inductor members formed on the interconnect dielectric layer;
   a plurality of photoresist spacers positioned between the plurality of magnetic core inductor members;
   a planarization surface formed over the plurality of magnetic core inductor members;
   an electrically insulating layer formed over the planarization surface;
   a plating layer formed over the electrically insulating layer, the plating layer including at least one metal;
   an inductor coil formed over the plurality of magnetic core inductor members;
   a photoresist material covering at least portions of the inductor coil; and a layer of non-conductive magnetic paste formed over the inductor coil layer, wherein the electrically insulating layer, the planarization surface and the plating layer are positioned between the plurality of magnetic core inductor members and the inductor coil and wherein the non-conductive paste contains magnetic particles having various sizes ranging from approximately 1 to 10 microns and wherein the fill factor of the magnetic particles is between approximately 80 and 90 percent.

2. The apparatus as recited in claim 1 further comprising a metal interconnect layer formed under the interconnect dielectric layer and an electrical contact extending from the coil through at least the planarization surface, the insulating layer and the plating layer to connect with the metal interconnect layer.

3. The apparatus as recited in claim 1, wherein the apparatus is a semiconductor die and the plurality of magnetic core inductor members are arranged in a chevron pattern and are positioned around the periphery of the die.

4. The apparatus as recited in claim 1, wherein the plating layer includes one of a group consisting of titanium and copper and wherein the planarization surface includes one of a group consisting of benzocyclobutene (BCB) and SU-8 photoresist and wherein the plating layer and the planarization surface have different compositions and wherein the electrically insulating layer and the plating layer have different compositions.

5. The apparatus as recited in claim 1, wherein:
the plurality of magnetic core inductor members underlies and is magnetically coupled with the inductor coil; and
the non-conductive magnetic paste overlies the inductor coil and is magnetically coupled with the inductor coil, there being no magnetic material other than the magnetic paste that both overlies the inductor coil and that is magnetically coupled with the inductor coil.

6. The apparatus as recited in claim 1, wherein the non-conductive magnetic paste is in contact with portions of the inductor coil.

7. The apparatus as recited in claim 1, wherein the plurality of magnetic core inductor members and the layer of non-conductive magnetic paste cooperate to form a magnetic core structure that substantially surrounds the inductor coil.

8. The apparatus as recited in claim 1 comprising a core layer that includes the plurality of magnetic core inductor members, the core layer having a top surface and an opposing bottom surface, each of the plurality of magnetic core inductor members extending between the top and bottom surfaces of the core layer, wherein:
the top surface of the core layer and a surface of the layer of non-conductive magnetic paste face one another and have substantially similar dimensions;
at least a portion of the layer of non-conductive magnetic paste is exposed on an exterior surface of the apparatus; and
the inductor coil is positioned between the layer of non-conductive magnetic paste and the core layer.

9. The apparatus of claim 1, wherein each of the plurality of magnetic core inductor members does not completely encircle the inductor coil.

10. The apparatus of claim 1, wherein the magnetic core inductor members are made of NiFe.

11. The apparatus of claim 1, wherein the magnetic core inductor members are laminations perpendicular to the direction of current flow through the inductor coil.

12. The apparatus of claim 1, wherein said apparatus is located within a semiconductor wafer including a plurality of the apparatuses as recited in claim 1.

13. A method of forming the apparatus of claim 1, comprising:
fabricating a semiconductor wafer including a plurality of dice, each of the die including power circuitry; and
fabricating a plurality of inductors directly onto the plurality of dice on the wafer, each of the inductors in electrical contact with the power circuitry on each of the die respectively.

14. The method of claim 13, wherein fabricating the semiconductor wafer further comprises forming a switching node contact in electrical connection with the power circuitry on each of the die on the wafer respectively.

15. The method of claim 13, wherein fabricating each of the plurality of inductors further comprises:
forming a plurality of magnetic core inductor members on an interconnect dielectric layer formed over each die on the wafer respectively; and
forming a plurality of inductor coils over the plurality of magnetic core inductor members over each die on the wafer respectively.

16. The method of claim 15, further comprising forming a layer of magnetic paste over the plurality of inductor coils respectively.

17. The method of claim 15, wherein forming the plurality of magnetic core inductor members further comprises forming a plurality rectangular shaped members of NiFe patterned on the wafer surface.

18. The method of claim 17, wherein forming the plurality of magnetic core inductor members further comprises:
forming an adhesion layer over the interconnect dielectric layer formed over each die on the wafer respectively;
forming a seed layer over the adhesive layer; and
forming an oxide protection layer over the seed layer.

19. The method of claim 18, wherein further comprising:
sputtering titanium over the interconnect dielectric layer to form the adhesion layer;
sputtering copper over the titanium layer to form the seed layer; and
sputtering a second titanium layer over the copper layer to form the oxide protection layer.

20. The method of claim 18, wherein forming a plurality rectangular shaped members of NiFe patterned on the wafer surface further comprises:
forming a photoresist layer over the second titanium layer;
patterning the photoresist layer to form rectangular shaped molds in the photoresist layer; and
filling the molds with NiFe to form the plurality of rectangular shaped members.

21. The method of claim 20, wherein filling the molds further comprises:
stripping the second titanium layer within the molds;
applying a negative potential to the wafer; and
electroplating the wafer in a NiFe electroplate bath.

22. The method of claim 15, wherein forming a plurality of inductor coils over the plurality of magnetic core inductor members further comprises:
forming a planarization surface over the plurality of magnetic core inductor members on the wafer surface; and
planarizing the planarization surface.

23. The method of claim 22, wherein planarizing the planarization surface further comprises performing chemical mechanical polishing of a spin-on BCB or SU8 material.

24. The method of claim 22, further comprising forming an insulation layer over the planarization surface.

25. The method of claim 24, wherein forming the plurality of inductor coils further comprises:

forming adhesive, seed and oxide layers over the insulation layer respectively;

forming a photo resist layer over the insulation layer;

patterning the photo resist layer to form a plurality molds;

removing the oxide layer within the plurality of molds; and filling the plurality of molds with copper.

26. An apparatus, comprising:

an integrated circuit with power regulation circuitry fabricated thereon;

a switching node contact in electrical connection with the power regulation circuitry on the integrated circuit;

an interconnect dielectric layer formed over the power regulation circuitry and the switching node contact of the integrated circuit;

a plurality of magnetic core inductor members formed on the interconnect dielectric layer;

a planarization surface formed over the plurality of magnetic core inductor members;

an electrically insulating layer formed over the planarization surface;

a plating layer formed over the electrically insulating layer, the plating layer including at least one metal;

an inductor coil formed over the plurality of magnetic core inductor members; and a layer of non-conductive magnetic paste formed over the inductor coil, wherein the electrically insulating layer, the planarization surface and the plating layer are positioned between the plurality of magnetic core inductor members and the inductor coil and wherein the non-conductive paste contains magnetic particles having various sizes ranging from approximately 1 to 10 microns and wherein the fill factor of the magnetic particles is between approximately 80 and 90 percent.

* * * * *